United States Patent [19]
Wallrafen

[11] Patent Number: 5,172,065
[45] Date of Patent: Dec. 15, 1992

[54] EVALUATION CIRCUIT FOR A CAPACITIVE SENSOR

[75] Inventor: Werner Wallrafen, Schwalbach, Fed. Rep. of Germany

[73] Assignee: VDO Adolf Schindling AG, Frankfurt/Main, Fed. Rep. of Germany

[21] Appl. No.: 621,044

[22] Filed: Nov. 30, 1990

[30] Foreign Application Priority Data

Jan. 23, 1990 [DE] Fed. Rep. of Germany ....... 4001814

[51] Int. Cl.$^5$ .............................................. G01R 27/26
[52] U.S. Cl. .................................. 324/683; 324/663; 324/676
[58] Field of Search ............... 324/663, 664, 665, 666, 324/676, 683, 689

[56] References Cited

U.S. PATENT DOCUMENTS 4,243,114  1/1981  Brouwer .......................... 324/676 X

FOREIGN PATENT DOCUMENTS 0175362  9/1985  European Pat. Off. .

Primary Examiner—Gerard R. Strecker
Assistant Examiner—Diep Do
Attorney, Agent, or Firm—Martin A. Farber

[57] ABSTRACT

In an evaluation circuit for a capacitive sensor, the capacitive sensor and a capacitor form a capacitive voltage divider, the end terminals of which can be fed with opposite-phase alternating voltages of the same frequency. The junction point between the capacitor and the capacitive sensor is connected, together with a tap of a voltage source of high internal resistance, to the input of an impedeance transformer. The output of the impedance transformer is connected to a synchronous demodulator to which at least one phase of the alternating voltage is fed.

7 Claims, 2 Drawing Sheets

EVALUATION CIRCUIT FOR A CAPACITIVE SENSOR

FIELD AND BACKGROUND OF THE INVENTION

The present invention relates to an evaluation circuit for a capacitive sensor.

In order to produce electrical signals as a function of different physical variables, capacitive sensors are known in which the capacitance of a capacitor is dependent on the specific physical variable. The capacitance values are frequently within a range of 1 pF to 10 pF and thus difficult to evaluate. In those cases in which the capacitances of two capacitors vary in opposite directions, simpler circuits have become known, but the provision of so-called differential capacitors is not always possible.

From European Patent EP 0 175 362 A2 a capacitive sensor for the control of a windshield wiper is known in which the wetness-dependent capacitance is part of an oscillator circuit. Due to their low capacitance, however, such circuits oscillate only with very high frequency. This, in its turn, results in susceptibility to disturbance through radiations and losses in the windshield.

SUMMARY OF THE INVENTION

It is an object of the invention to convert small capacitances into electric signals and, in particular, to provide an evaluation circuit for a capacitive rain sensor for motor vehicles which can be produced at the lowest possible expense and operates reliably.

According to the evaluation circuit of the invention, a capacitive sensor (6) and a capacitor (7) form a capacitive voltage divider the end terminals of which can be fed alternating voltages of the same frequency in opposite phase. The junction point between the capacitor (7) and the capacitive sensor (6) are connected, together with a tap of a voltage source (4A) of high internal resistance (4B), to the input of an impedance transformer (8). The output of the impedance transformer (8) is connected to a synchronous demodulator (10, 11, 12) to which, furthermore, at least one phase of the alternating voltage can be fed.

The evaluation circuit of the invention furthermore affords the possibility of connecting another electrode terminal of the capacitive sensor to the output of the impedance transformer. In this way there is possible a reduction of the influence of further capacitances in the sensor which would further reduce the relative change in the sensor capacitance, which is already low.

According to a feature of the invention, the output of the impedance transformer (8) is furthermore connected via another capacitor (16) to a terminal (X) of the capacitive sensor (6) which faces away from the source of alternating voltage.

The evaluation circuit of the invention has the advantage that it is sensitive to small changes in capacitance but is insensitive to noise signals, and that the non-negligible input capacitance and the input no-signal currents of the amplifier have less of an effect than in known circuits. Furthermore, drift phenomena, for example changes caused by temperature, have less effect. Furthermore, a coupling of noise signals into the highly sensitive tap of the capacitive voltage divider is substantially completely suppressed by a synchronous demodulation provided that the noise signals are not correlated with the controlled alternating voltage. The evaluation circuit of the invention is particularly suitable for rain sensors on motor vehicles for the automatic control of windshield wipers. However, other applications of the evaluation circuit are also possible.

A further suppression of disturbances is possible as a result of a further development of the invention which resides in the fact that a band-pass filter (9) is arranged between the impedance transformer (8) and the synchronous demodulator (10, 11, 12).

Another development provides that the opposite-phase alternating voltages are of rectangular shape. In this way, residual ripple in the output voltage of the evaluation circuit of the invention is avoided in practice.

According to a feature of the invention, a voltage divider (4B) provides the tap of the capacitive voltage divider (6, 7) with high-impedance bias.

One advantageous embodiment of the evaluation circuit of the invention provides that as synchronous demodulator there are provided two controllable switches (11, 12) to which the opposite-phase alternating-voltage signals can be fed as control voltages, and that the input of the one controllable switch (12) can be acted on by the non-inverted output voltage of the impedance transformer (8) or of the band-pass filter (9), and that the input of the other controllable switch (11) can be acted on by the inverted output voltage. Accordingly, multiplication is effected by +1 or −1 depending on the phase.

For the further smoothing of the output voltage, a low-pass filter (13) can be provided behind the synchronous demodulator (10-12).

BRIEF DESCRIPTION OF THE DRAWING

With the above and other objects and advantages in view, the present invention will become more clearly understood in connection with the detailed description of a preferred embodiment when considered with the accompanying drawing, of which.

DETAILED DESCRIPTION OF THE PREFERRED EMBODIMENTS

Identical parts in the figures have been provided with the same reference numbers.

Figure 1:
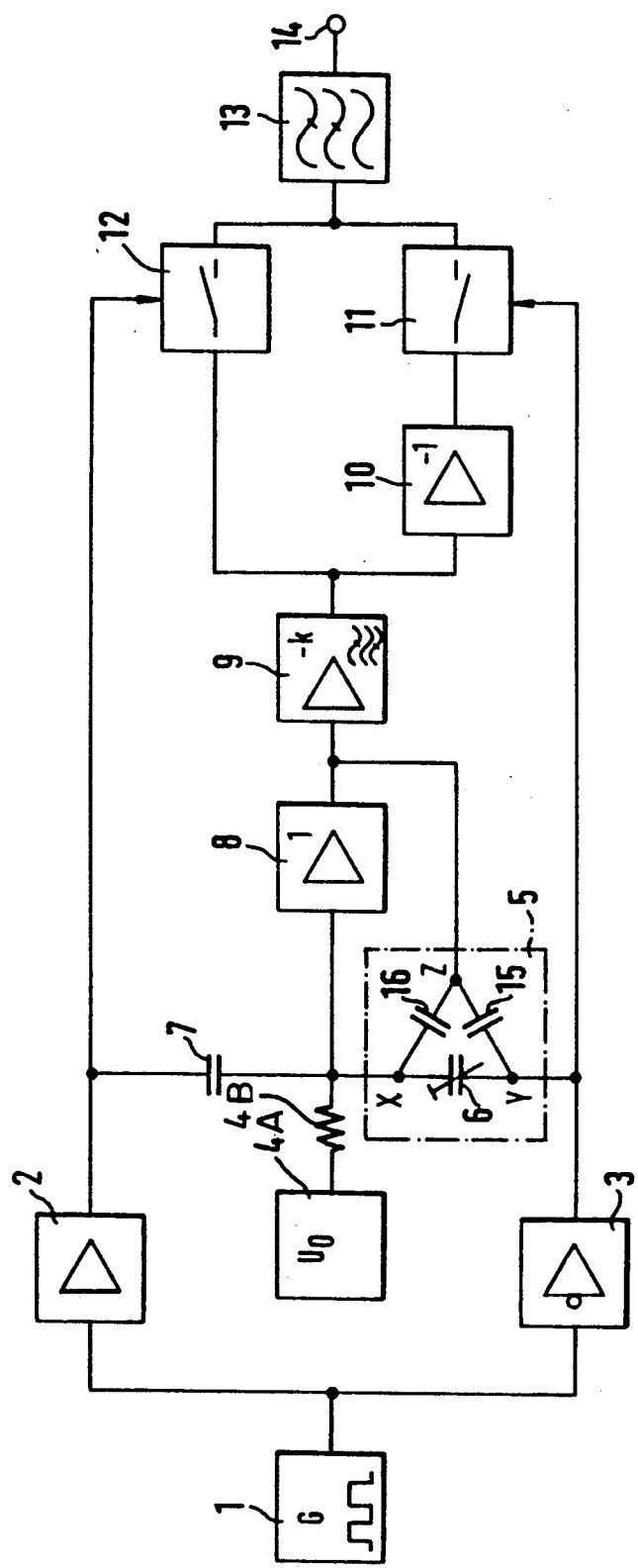
FIG. 1 is a block-circuit diagram of one embodiment.

In the evaluation circuit of FIG. 1, a generator 1 is provided which produces a rectangular alternating voltage which is conducted via two drivers 2, 3 and inverted in the driver 3. The opposite-phase alternating voltages pass from the output of the drivers 2, 3 to a capacitive voltage divider.

The capacitive voltage divider consists of a capacitor 6 which is part of a wetness sensor 5, the capacitance of the divider being dependent on the amount of water on the windshield, and upon a fixed capacitor 7. The capacitance of the capacitor 7 is preferably selected within a range of variation of the capacitance of the capacitor 6. A tap of the voltage divider is connected to the input of an impedance transformer 8 which has a high input impedance and a degree of amplification of 1.

The voltage source 4A, which preferably has a higher internal resistance 4B than the impedance of the capacitive voltage divider, represents a well-defined operating point. The output of the impedance transformer 8 is connected to a terminal Z of the sensor 5, from which, in each case, a capacitor 15, 16 leads to the terminals X, Y of the sensor 5.

There is also connected to the impedance transformer 8 an inverting amplifier 9 having band-pass characteristics the output of which is connected, on the one hand, via an invertor 10 to a first controllable switch 11 and, on the other hand, directly to a second controllable switch 12. The controllable switches 11, 12 are controlled synchronously with the alternating voltages of opposite phase and are, in each case, conductive during a half period of the alternating voltages. The outputs of the controllable switches 11, 12 are connected via a low-pass filter 13 to the output terminal 14 of the evaluation circuit.

If the capacitances of the capacitors 6, 7 are of equal value, then the input and the voltages of the impedance transformer 8 are at zero volts with respect to alternating voltage, and at a voltage of $U_0$ with respect to direct-current voltage. Depending on the amount of wetness, the capacitance of the capacitor 6 may be less or more than that of the capacitor 7. A superimposed rectangular alternating voltage then results on the output of the impedance transformer 8, the amplitude and phase of the voltage depending on the amount of wetness. The alternating-voltage part is amplified in the amplifier 9 and, at the same time, freed of disturbances which contain frequencies other than the frequency of the alternating voltage.

The inverter 10 and the controllable electronic switches 11, 12 represent a synchronous demodulator which demodulates the output voltage of the amplifier 9 in proper phase. Low-pass filter 13 eliminates residual ripple which, in any event, is all the smaller since, by the substantial frequency independence of the capacitive voltage divider, the rectangular shape of the alternating voltage is retained at the output of the amplifier 9.

At the output terminal 14 of the evaluation circuit of FIG. 1 there is then available a DC voltage which is proportional to the capacitance of the sensor capacitor 6. By the feedback of the output voltage of the impedance transformer 8 to the terminal Z of the sensor 5, there is possible a reduction of the influence of further capacitances in the sensor which would reduce the relative change in the sensor capacitance, which is already low. As a result of the band-pass characteristic of the amplifier 9, the DC voltage part, among other things, is suppressed so that drift phenomena such as, for instance, dependencies on temperature or no-signal currents which change with time do not make themselves perceptible in the result of the measurement.

Figure 2:
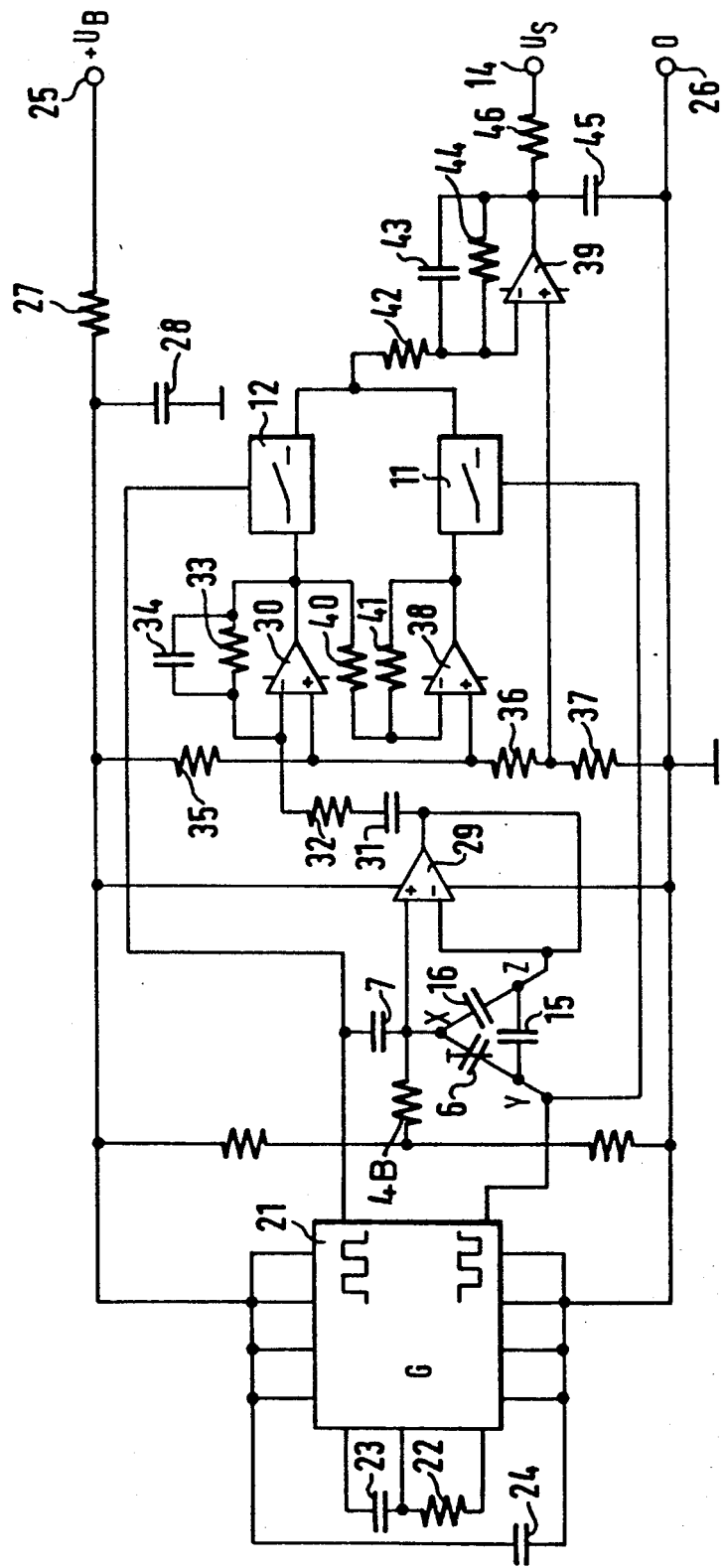
FIG. 2 is a circuit diagram with integrated components as another embodiment.

FIG. 2 shows a practical embodiment of an evaluation circuit, the function of which corresponds to the evaluation circuit of FIG. 1. An integrated component 21 is used as generator for a rectangular alternating voltage. A resistor 22 and a capacitor 23 serve here as frequency-determining member. A capacitor 24 is furthermore provided in order to avoid noise signals. The component 21, like the other parts of the circuit, receives an operating voltage of, for instance, $U_B = 5$ V over terminals 25, 26 and over a filter section 27, 28.

The ohmic voltage divider (4B) serves as high-impedance voltage source with low parasitic stray capacitance, and the capacitive voltage divider 6, 7 as well as the sensor 5 have already been explained in connection with FIG. 1. As impedance transformer there is used an operational amplifier 29 whose output is connected to the inverting input so that an amplification factor of 1 results.

As amplifier and band-pass filter 9 (FIG. 1) there is employed in the circuit of FIG. 2 another operational amplifier 30 to the inverting input of which the output voltage of the operational amplifier 29 is fed via a capacitor 31 and a resistor 32. The capacitor 31 serves to provide a lower limit to the band at the lower frequencies. A resistor 33 is present in the negative-feedback circuit. The upper frequency limit of the band is determined by means of a feedback capacitance comprising a capacitor 34. The non-inverting input of the operational amplifier 30 receives a constant bias voltage via a voltage divider 35, 36, 37, which also serves to produce bias voltages for further operational amplifiers 38, 39.

The operational amplifier 38 serves as inverter with an amplification factor of 1 with a negative-feedback resistor 41, and is connected, via a resistor 40, to the output of the operational amplifier 30. The controllable switches 11, 12 are developed in known manner by integrated components.

The outputs of the controllable switches are connected via a resistor 42 to the inverting input of the operational amplifier 39 which represents a low-pass filter, and for this purpose is provided with a frequency-dependent negative feedback comprising a capacitor 43 in parallel with a resistor 44. Furthermore, the output of the operational amplifier 39 is connected to ground potential via a capacitor 45. Finally, the output voltage of the operational amplifier 39 is conducted over a protective resistor 46 to the output terminal 14 of the circuit.

I claim:

1. An evaluation circuit for a capacitive sensor, comprising:
    a capacitive sensor and a first capacitor connected to the sensor to form therewith a capacitive voltage divider, the voltage divider having end terminals for receiving alternating voltages of equal frequency but having opposite phase, there being a junction point between said first capacitor and said capacitive sensor;
    a second capacitor, a voltage source of high internal resistance, an impedance transformer, and a synchronous demodulator; and
    wherein said junction point is connected, together with a tap of said voltage source, to an input of said impedance transformer;
    an output of the impedance transformer is connected directly by said second capacitor to the junction point, said output of the impedance transformer also being connected to said synchronous demodulator; and
    the alternating voltages are applied to said synchronous demodulator to accomplish measurement of capacitance of said sensor in a range of capacitance values including a low range of approximately 1–10 picofarads.

2. A circuit according to claim 1, further comprising a band-pass filter connected between said impedance transformer and said synchronous demodulator.

3. A circuit according to claim 1, wherein said alternating voltages have a waveform of rectangular shape.

4. A circuit according to claim 3, further comprising a resistive divider having a tap connected to the junction of said capacitive voltage divider, the resistive voltage divider providing a high-impedance bias.

5. A circuit according to claim 1, further comprising a band-pass filter; and wherein
said synchronous demodulator comprises a first and a second controllable switch which receive the opposite-phase alternating-voltage signals as control voltages of the switches;
an input of said first controllable switch is operative in response to a non-inverted output voltage of said impedance transformer coupled via said band-pass filter; and
an input of said second controllable switch is operative in response to an inverted output voltage to provide multiplication by +1 or −1 depending on the phase.

6. A circuit according to claim 5, further comprising a second low-pass filter connected to an output of said synchronous demodulator.

7. A circuit according to claim 1, wherein said capacitive sensor has a first terminal and a second terminal, said circuit further comprising
a third capacitor, said second capacitor and said third capacitor being serially connected between said first and said second terminals of said capacitive sensor, there being a second junction point at a connection between said third and said second capacitors; and
wherein the output of said impedance transformer is connected to said second junction point.

* * * * *